(12) United States Patent
Chow et al.

(10) Patent No.: US 7,566,966 B2
(45) Date of Patent: Jul. 28, 2009

(54) INTEGRATED CIRCUIT PACKAGE-ON-PACKAGE SYSTEM WITH ANTI-MOLD FLASH FEATURE

(75) Inventors: Seng Guan Chow, Singapore (SG); Heap Hoe Kuan, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 153 days.

(21) Appl. No.: 11/850,197

(22) Filed: Sep. 5, 2007

(65) Prior Publication Data

US 2009/0057863 A1   Mar. 5, 2009

(51) Int. Cl.
*H01L 23/34*   (2006.01)
(52) U.S. Cl. ..................... 257/723; 257/787
(58) Field of Classification Search ............ 257/685, 257/686, 723, 777, 787
See application file for complete search history.

(56) References Cited

U.S. PATENT DOCUMENTS

| 6,452,268 | B1 | 9/2002 | Huang |
| 6,870,274 | B2 | 3/2005 | Huang |
| 6,995,448 | B2 | 2/2006 | Lee et al. |
| 6,998,721 | B2 | 2/2006 | Zhou |
| 7,192,798 | B2 | 3/2007 | Okada et al. |

*Primary Examiner*—Roy K Potter
(74) *Attorney, Agent, or Firm*—Mikio Ishimaru

(57) ABSTRACT

An integrated circuit package-on-package system includes: mounting an integrated circuit package system having a mountable substrate over a package substrate; forming a package encapsulation having both a recess and an anti-mold flash feature over the package substrate and the integrated circuit package system including: forming the anti-mold flash feature having an extension width at the bottom of the recess, and partially exposing the mountable substrate in the recess with the anti-mold flash feature over mountable substrate; and mounting an integrated circuit device over the mountable substrate in the recess.

20 Claims, 2 Drawing Sheets

INTEGRATED CIRCUIT PACKAGE-ON-PACKAGE SYSTEM WITH ANTI-MOLD FLASH FEATURE

TECHNICAL FIELD

The present invention relates generally to an integrated circuit package system and more particularly to an integrated circuit package-on-package system.

BACKGROUND ART

In order to interface an integrated circuit with other circuitry, it is common to mount it on a lead frame or substrate. Each integrated circuit has bonding pads that are individually connected to the substrate's contact or terminal pads using extremely fine gold or aluminum wires or conductive balls, such as solder balls. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". Particularly acute, the needs for portable personal electronics, such as cell phones, digital cameras, music players, personal digital assistants (PDA's), and location-based devices, have further driven the need for increased integrated circuit density.

This increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of a printed circuit board (PCB) substrate onto which a set of separate integrated circuit components are directly attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. Moreover, the substrate and integrated circuit are often damaged during assembly or testing, complicating the manufacturing process and increasing costs.

For both vertical and horizontal multi-chip packages, assembly of the multi-chip packages must have reliable electrical and mechanical attachments between the multiple integrated circuits, the stacked packaged integrated circuits, or a combination thereof. For example, the encapsulating process for forming the packaged integrated circuit may cause contamination, such as mold flash or bleed, impeding reliable attachments.

Thus, a need still remains for an integrated circuit package-on-package system providing low cost manufacturing, improved yield, improved reliability, and greater flexibility to offer more functionality and fewer footprints on the printed circuit board. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package-on-package system including: mounting an integrated circuit package system having a mountable substrate over a package substrate; forming a package encapsulation having both a recess and an anti-mold flash feature over the package substrate and the integrated circuit package system including: forming the anti-mold flash feature having an extension width at the bottom of the recess, and partially exposing the mountable substrate in the recess with the anti-mold flash feature over the mountable substrate; and mounting an integrated circuit device over the mountable substrate in the recess.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
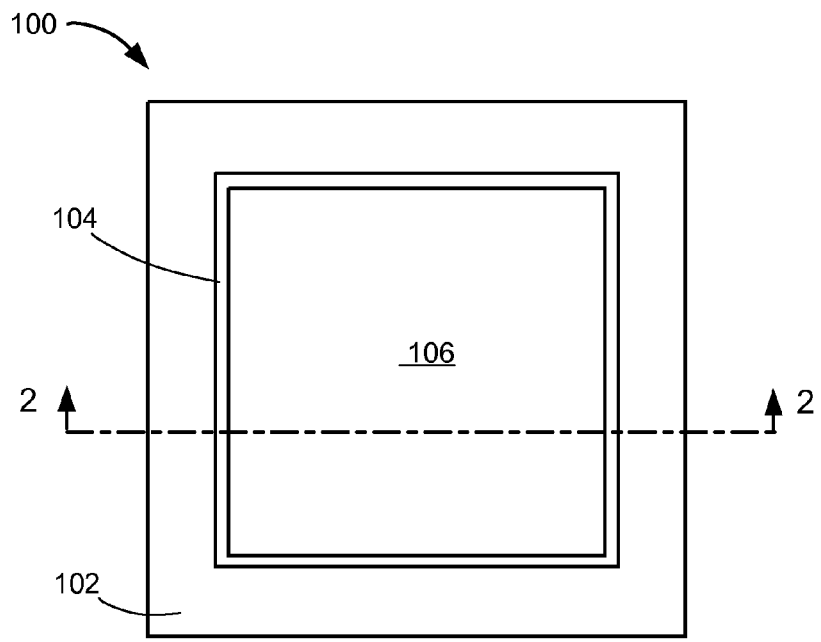
FIG. 1 is a top view of an integrated circuit package-on-package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package-on-package system 100 in an embodiment of the present invention. The top view depicts a mountable integrated circuit package system 102, such as an integrated circuit package system, having a recess 104. An integrated circuit device 106, such as an integrated circuit package system or an integrated circuit die, preferably mounts over the mountable integrated circuit package system 102 and in the recess 104.

For illustrative purposes, the recess 104 is shown extending beyond the horizontal dimensions of the integrated circuit device 106, although it is understood that the length and width of the integrated circuit device 106 may extend beyond a horizontal dimension of the recess 104. Also for illustrative purposes, the integrated circuit package-on-package system 100 is shown having one device or the integrated circuit device 106 mounted over the mountable integrated circuit package system 102, although it is understood that the multiple devices of similar or dissimilar types, technologies, functions, or a combination thereof may mounted over the mountable integrated circuit package system 102.

Figure 2:
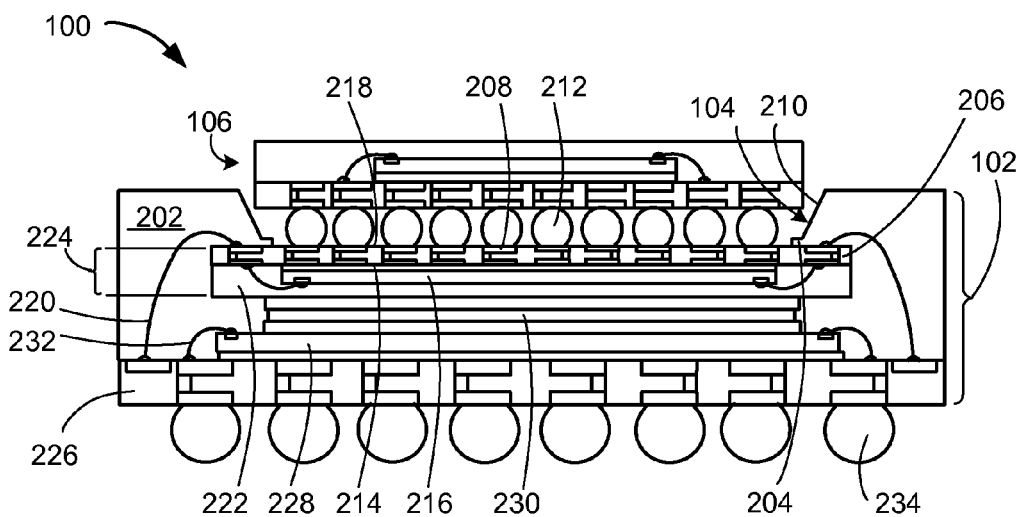
FIG. 2 is a cross-sectional view of the integrated circuit package-on-package system along line 2-2 of FIG. 1.

Referring now to FIG. 2, therein is shown a cross-sectional view of the integrated circuit package-on-package system 100 along line 2-2 of FIG. 1. As mentioned in FIG. 1, the integrated circuit device 106 preferably mounts over the mountable integrated circuit package system 102 and within the recess 104. The recess 104 is formed in a package encapsulation 202, such as an epoxy molding compound, of the mountable integrated circuit package system 102.

The package encapsulation 202 includes anti-mold flash features 204 at the innermost portions of the recess 104. The anti-mold flash features 204 cover a portion of a mountable substrate 206, such as a laminated substrate or a redistribution structure, exposed by the recess 104 without covering or contaminating the exposed portions of contact pads 208 of the mountable substrate 206. The package encapsulation 202 may provide the recess 104 with a sloped portion 210 continuing to the anti-mold flash features 204. For illustrative purposes, the package encapsulation 202 is shown providing the recess 104 with the sloped portion 210, although it is understood that the recess 104 may be formed from with different geometric configuration, such as a vertical step configuration to the anti-mold flash features 204.

The integrated circuit device 106 preferably includes external connectors 212, such as solder balls. The external connectors 212 may attach with the contact pads 208 exposed in the recess 104 connecting the integrated circuit device 106 and the mountable integrated circuit package system 102. The anti-mold flash features 204 do not impede the connections between the external connectors 212 and the mountable substrate 206.

A first surface 214 of the mountable substrate 206 is preferably attached to a first integrated circuit 216, such as an integrated circuit die, and a second surface 218 of the mountable substrate 206 provides a surface for mounting the integrated circuit device 106 as well as first electrical interconnects 220, such as bond wires or ribbon bond wires.

The first integrated circuit 216 preferably mounts and electrically connects to the first surface 214 of the mountable substrate 206. The first integrated circuit 216 is preferably encapsulated with an inner encapsulation 222, such as an epoxy molding compound, forming a first integrated circuit package system 224.

A package substrate 226, such as a laminated substrate or a printed circuit board, may include a second integrated circuit 228, such as an integrated circuit die, thereover. A spacer 230, such as a silicon spacer or film spacer, may be included between the first integrated circuit package system 224 and the second integrated circuit 228. The spacer 230 may serve a number of functions. For example, the spacer 230 may provide clearance for second electrical interconnects 232, such as bond wires or ribbon bond wires, connecting the second integrated circuit 228 and the package substrate 226.

The package encapsulation 202 is preferably formed over the package substrate 226 covering the second integrated circuit 228, the spacer 230, the first electrical interconnects 220, and the second electrical interconnects 232. The package encapsulation 202 partially covers the first integrated circuit package system 224 exposing the mountable substrate 206. External interconnects 234, such as solder balls, preferably are mounted below the package substrate 226.

Figure 3:
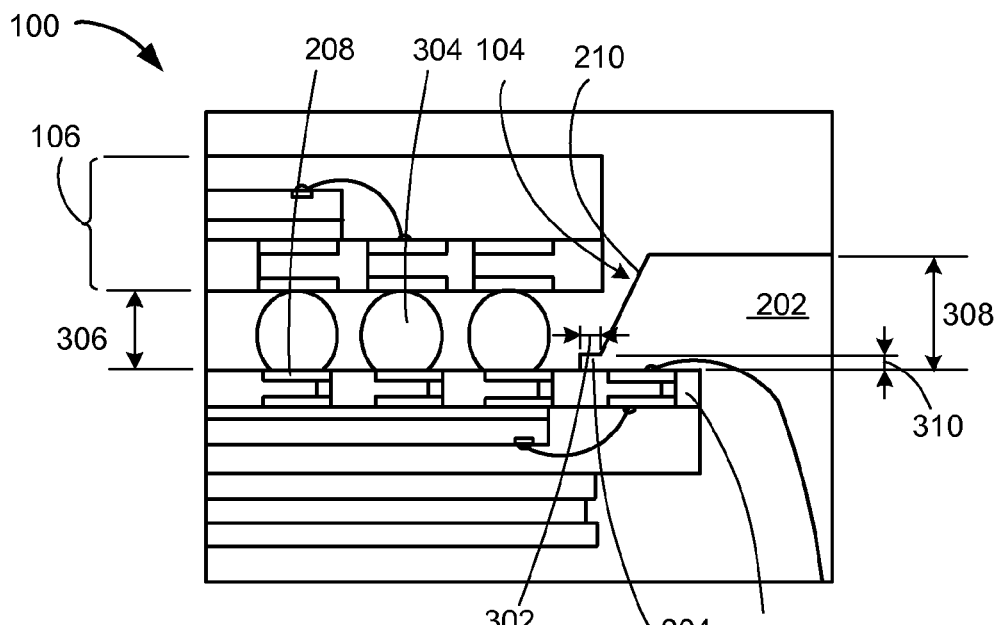
FIG. 3 is a more detailed cross-sectional view of a portion of the integrated circuit package-on-package system of FIG. 2.

Referring now to FIG. 3, therein is shown a more detailed cross-sectional view of a portion of the integrated circuit package-on-package system 100 of FIG. 2. The more detailed cross-sectional view depicts the anti-mold flash features 204 having an extension width 302 from the bottom portion of the recess 104. As mentioned earlier, the anti-mold flash features 204 extend over the mountable substrate 206 without impeding the contact pads 208 exposed in the recess 104.

Electrical connectors 304 have a connector height 306 above the mountable substrate 206. The package encapsulation 202 adjacent to the recess 104 has a recess height 308 above the mountable substrate 206. The recess height 308 may be greater than the connector height 306. For illustrative purposes, the integrated circuit package-on-package system 100 is shown having the recess height 308 greater than the connector height 306, although it is understood that the recess height 308 may not be greater than the connector height 306. For example, the recess height 308 may be less than the connector height 306 with the integrated circuit device 106 extending beyond the recess 104.

The anti-mold flash features 204 have a bleed protection height 310 above the mountable substrate 206. The bleed protection height 310 is less than the connector height 306 such that the anti-mold flash features 204 do not impede connections between the integrated circuit device 106 and the mountable substrate 206.

For illustrative purposes, the anti-mold flash features 204 are shown having a single stepped configuration, although it is understood that the anti-mold flash features 204 may have different configurations. For example, the anti-mold flash features 204 may be formed in a multi-stepped configuration. Another example, the anti-mold flash features 204 may have the different configurations throughout the boundary of the package encapsulation 202 in the recess 104.

Figure 4:
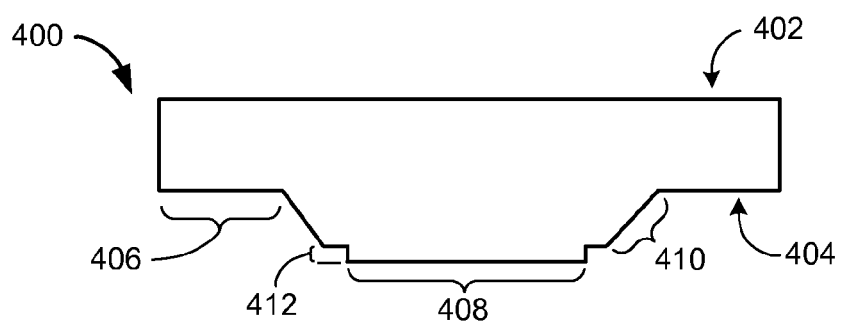
FIG. 4 is a cross-sectional view of a mold chase for forming the integrated circuit package-on-package system of FIG. 2.

Referring now to FIG. 4, therein is shown a cross-sectional view of a mold chase 400 for forming the integrated circuit package-on-package system 100 of FIG. 2. The mold chase 400 helps form the package encapsulation 202 of FIG. 2. More specifically, the mold chase 400 preferably includes complementary structures for forming the recess 104 of FIG. 2 in the package encapsulation 202 and the anti-mold flash features 204 of FIG. 2. The mold chase 400 includes an exterior side 402 and an interior side 404, wherein the interior side 404 includes structures for forming the recess 104 and the anti-mold flash features 204. The exterior side 402 is a side of the mold chase 400 that is opposite the interior side 404.

The interior side 404 may include planar portions 406 at the periphery of the portion of the mold chase 400 shown. From the planar portions 406 towards a central portion 408 of the mold chase 400, the interior side 404 continues with angled portions 410 preferably used for forming the sloped portion 210 of FIG. 2 and the recess 104 of the package encapsulation 202. From the angled portions 410 continuing towards the central portion 408, the angled portions 410 continues to stepped portions 412 preferably used for forming the anti-mold flash features 204. Between the stepped portions 412, the central portion 408 is preferably a horizontal portion with the portion of the mold chase 400 shown having the greatest thickness at the central portion 408 from the interior side 404 to the exterior side 402.

The mold chase 400 preferably forms the recess 104 and the anti-mold flash features 204 and as such may have different structural configurations. For illustrative purposes, the stepped portions 412 are shown having a single stepped configuration, although it is understood that the stepped portions 412 may have different configurations. For example, the stepped portions 412 may be formed in a multi-stepped configuration. Another example, the stepped portions 412 may have the different configurations throughout the boundary of the package encapsulation 202 in the recess 104. Also for illustrative purposes, the mold chase 400 is shown providing the angled portions 410 to the stepped portions 412, although it is understood that the mold chase 400 may be formed from with different geometric configuration, such as a vertical step configuration to the stepped portions 412.

Figure 5:
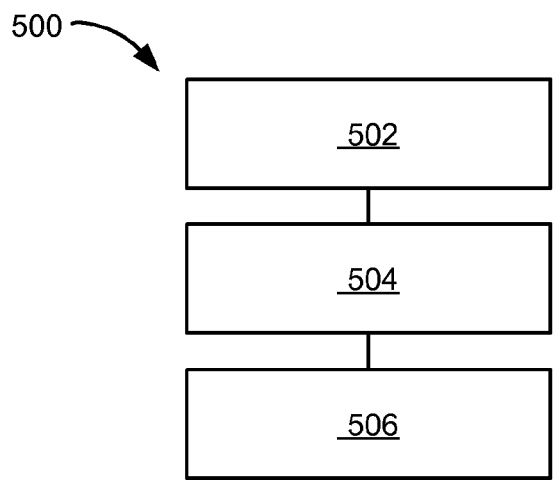
FIG. 5 is a flow chart of an integrated circuit package-on-package system for manufacturing of the integrated circuit package-on-package system in an embodiment of the present invention.

Referring now to FIG. 5, therein is shown a flow chart of an integrated circuit package-on-package system 500 for manufacturing the integrated circuit package-on-package system 100 in an embodiment of the present invention. The system 500 includes mounting an integrated circuit package system having a mountable substrate over a package substrate in a block 502; forming a package encapsulation having both a recess and an anti-mold flash feature over the package substrate and the integrated circuit package system including: forming the anti-mold flash feature having an extension width at the bottom of the recess, and partially exposing the mountable substrate in the recess with the anti-mold flash feature over the mountable substrate in a block 504; and mounting an integrated circuit device over the mountable substrate in the recess in a block 506.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-on-package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package-on-package system comprising:
   mounting an integrated circuit package system having a mountable substrate over a package substrate;
   forming a package encapsulation having both a recess and an anti-mold flash feature over the package substrate and the integrated circuit package system including:
      forming the anti-mold flash feature having an extension width at the bottom of the recess, and
      partially exposing the mountable substrate in the recess with the anti-mold flash feature over the mountable substrate; and
   mounting an integrated circuit device over the mountable substrate in the recess.

2. The system as claimed in claim 1 wherein:
   mounting the integrated circuit package system includes:
      having the mountable substrate with a contact pad;
   forming the package encapsulation having both the recess and the anti-mold flash feature includes:
      exposing the contact pad in the recess;
      preventing contamination from the package encapsulation over the contact pad with the anti-mold flash feature; and
   mounting the integrated circuit device over the mountable substrate in the recess includes:
      connecting the integrated circuit device and the contact pad.

3. The system as claimed in claim 1 wherein forming the anti-mold flash feature having the extension width at the bottom of the recess includes forming the package encapsulation having a stepped configuration at the bottom of the recess.

4. The system as claimed in claim 1 wherein:
mounting the integrated circuit package system includes:
having the mountable substrate with a contact pad;
forming the package encapsulation having both the recess and the anti-mold flash feature includes:
exposing the contact pad in the recess;
preventing contamination from the package encapsulation over the contact pad with the anti-mold flash feature; and
mounting the integrated circuit device over the mountable substrate in the recess includes:
connecting an electrical connector of the integrated circuit device and the contact pad.

5. The system as claimed in claim 1 wherein forming the package encapsulation having both the recess and the anti-mold flash feature includes forming a sloped portion of the package encapsulation in the recess to the anti-mold flash feature.

6. An integrated circuit package-on-package system comprising:
mounting an integrated circuit package system having a mountable substrate over a package substrate with the mountable substrate having a contact pad;
connecting the integrated circuit package system with the package substrate;
forming a package encapsulation having both a recess and an anti-mold flash feature over the package substrate and the integrated circuit package system including:
forming the anti-mold flash feature having an extension width at the bottom of the recess, and
exposing a portion the mountable substrate and the contact pad in the recess with the anti-mold flash feature over the mountable substrate not contaminating the contact pad; and
mounting an integrated circuit device having an external connector over the mountable substrate in the recess with the external connector connected with the contact pad.

7. The system as claimed in claim 6 wherein mounting the integrated circuit package system having the mountable substrate over the package substrate includes mounting the integrated circuit package system over an integrated circuit with the integrated circuit over the package substrate.

8. The system as claimed in claim 6 wherein mounting the integrated circuit device having the external connector over the mountable substrate in the recess with the external connector connected with the contact pad includes connecting the external connector having a connector height adjacent to the anti-mold flash feature having a bleed protection height with the connector height is greater than the bleed protection height.

9. The system as claimed in claim 6 wherein forming the package encapsulation having both the recess the anti-mold flash feature includes molding the package encapsulation in a mold chase complementary structures at an interior side for forming the anti-mold flash feature.

10. The system as claimed in claim 6 further comprising attaching an external interconnect with the package substrate at an opposing side to the integrated circuit package system.

11. An integrated circuit package-on-package system comprising:
a package substrate;
an integrated circuit package system having a mountable substrate over the package substrate;
a package encapsulation having both a recess and an anti-mold flash feature over the package substrate and the integrated circuit package system including:
the anti-mold flash feature having an extension width at the bottom of the recess, and
the mountable substrate partially exposed in the recess with the anti-mold flash feature over the mountable substrate; and
an integrated circuit device mounted over the mountable substrate in the recess.

12. The system as claimed in claim 11 wherein:
the mountable substrate includes a contact pad exposed in the recess and the anti-mold flash feature for preventing contamination from the package encapsulation over the contact pad; and
the integrated circuit device is connected the contact pad.

13. The system as claimed in claim 11 wherein the anti-mold flash feature having the extension width at the bottom of the recess includes the package encapsulation having a stepped configuration at the bottom of the recess.

14. The system as claimed in of claim 11 wherein:
the mountable substrate includes a contact pad exposed in the recess and the anti-mold flash feature for preventing contamination from the package encapsulation over the contact pad; and
the integrated circuit device includes an electrical connector connected with the contact pad.

15. The system as claimed in claim 11 wherein the package encapsulation having both the recess and the anti-mold flash feature includes a sloped portion of the package encapsulation in the recess to the anti-mold flash feature.

16. The system as claimed in claim 11 wherein:
the mountable substrate includes a contact pad exposed in the recess and the anti-mold flash feature for preventing contamination from the package encapsulation over the contact pad;
the package encapsulation includes a sloped portion in the recess to the anti-mold flash feature; and
the integrated circuit device includes an electrical connector connected with the contact pad.

17. The system as claimed in claim 16 wherein the integrated circuit package system having the mountable substrate over the package substrate includes the integrated circuit package system over an integrated circuit with the integrated circuit over the package substrate.

18. The system as claimed in of claim 16 wherein:
the external connector has a connector height and adjacent to the anti-mold flash feature; and
the anti-mold flash feature has a bleed protection height with the connector height is greater than the bleed protection height.

19. The system as claimed in claim 16 wherein the integrated circuit device includes a packaged integrated circuit.

20. The system as claimed in claim 16 further comprising an external interconnect attached with the package substrate at an opposing side to the integrated circuit package system.

* * * * *